US012618135B2

(12) United States Patent
Trexler et al.

(10) Patent No.: US 12,618,135 B2
(45) Date of Patent: May 5, 2026

(54) METHOD OF MANUFACTURE OF PRECIOUS METAL LAMINATE

(71) Applicants: Adam Trexler, Portland, OR (US); Laurie Johansen, Grants Pass, OR (US); Paul Diffendaffer, Grants Pass, OR (US)

(72) Inventors: Adam Trexler, Portland, OR (US); Laurie Johansen, Grants Pass, OR (US); Paul Diffendaffer, Grants Pass, OR (US)

(73) Assignee: VALAURUM, INC., Portland, OR (US)

(*) Notice: Subject to any disclaimer, the term of this patent is extended or adjusted under 35 U.S.C. 154(b) by 0 days.

(21) Appl. No.: 17/555,170

(22) Filed: Dec. 17, 2021

(65) Prior Publication Data

US 2023/0193447 A1     Jun. 22, 2023

(51) Int. Cl.
*C23C 14/02* (2006.01)
*B32B 3/10* (2006.01)
(Continued)

(52) U.S. Cl.
CPC .............. *C23C 14/025* (2013.01); *B32B 3/10* (2013.01); *B32B 3/12* (2013.01); *B32B 3/18* (2013.01);
(Continued)

(58) Field of Classification Search
CPC ..... C23C 14/025; C23C 14/021; C23C 14/14; C23C 14/24; C23C 14/34; C23C 14/5873; C23C 14/027; C23C 14/028; C23C 14/02;

C23C 14/022; C23C 14/04; C23C 14/046; C23C 14/06; C23C 14/0635; C23C 14/08; C23C 14/20; C23C 28/30; C23C 28/32; C23C 28/321; C23C 28/325; C23C 28/34; C23C 28/341; C23C 28/345; B32B 3/10; B32B 3/12; B32B 3/18; B32B 3/263;
(Continued)

(56) References Cited

U.S. PATENT DOCUMENTS 4,261,738 A * 4/1981 Valentine ................ C22B 11/04
                                                            423/32
4,591,707 A     5/1986 Stenzel et al.
(Continued)

FOREIGN PATENT DOCUMENTS

CN          111916252 A      11/2020
EP            2453269 A1       5/2012
(Continued)

OTHER PUBLICATIONS

Machine Translation, Lochbihler EP 2453269 A1, May 2012. (Year: 2012).*
(Continued)

*Primary Examiner* — Michael E. La Villa
(74) *Attorney, Agent, or Firm* — Kilpatrick Townsend & Stockton LLP

(57) ABSTRACT

A precious metallic laminate may include a first transparent substrate, a transparent transition layer deposited on the first transparent substrate, and a metallic layer deposited on the transparent transition layer. The metallic layer may include a precious metal. The laminate may include a second transparent substrate covering the metallic layer.

8 Claims, 6 Drawing Sheets

(51) Int. Cl.

| | |
|---|---|
| *B32B 3/12* | (2006.01) |
| *B32B 3/18* | (2006.01) |
| *B32B 3/26* | (2006.01) |
| *B32B 3/30* | (2006.01) |
| *B32B 7/023* | (2019.01) |
| *B32B 15/04* | (2006.01) |
| *B32B 15/08* | (2006.01) |
| *B32B 15/085* | (2006.01) |
| *B32B 15/09* | (2006.01) |
| *B32B 27/30* | (2006.01) |
| *B32B 27/32* | (2006.01) |
| *B32B 27/36* | (2006.01) |
| *C23C 14/04* | (2006.01) |
| *C23C 14/06* | (2006.01) |
| *C23C 14/08* | (2006.01) |
| *C23C 14/14* | (2006.01) |
| *C23C 14/20* | (2006.01) |
| *C23C 14/24* | (2006.01) |
| *C23C 14/34* | (2006.01) |
| *C23C 14/58* | (2006.01) |
| *C23C 28/00* | (2006.01) |

(52) U.S. Cl.

CPC ............... *B32B 3/26* (2013.01); *B32B 3/263* (2013.01); *B32B 3/266* (2013.01); *B32B 3/30* (2013.01); *B32B 7/023* (2019.01); *B32B 15/04* (2013.01); *B32B 15/043* (2013.01); *B32B 15/08* (2013.01); *B32B 15/085* (2013.01); *B32B 15/09* (2013.01); *B32B 27/302* (2013.01); *B32B 27/304* (2013.01); *B32B 27/32* (2013.01); *B32B 27/36* (2013.01); *B32B 27/365* (2013.01); *C23C 14/02* (2013.01); *C23C 14/021* (2013.01); *C23C 14/022* (2013.01); *C23C 14/027* (2013.01); *C23C 14/028* (2013.01); *C23C 14/04* (2013.01); *C23C 14/046* (2013.01); *C23C 14/06* (2013.01); *C23C 14/0635* (2013.01); *C23C 14/08* (2013.01); *C23C 14/14* (2013.01); *C23C 14/20* (2013.01); *C23C 14/24* (2013.01); *C23C 14/34* (2013.01); *C23C 14/5873* (2013.01); *C23C 28/30* (2013.01); *C23C 28/32* (2013.01); *C23C 28/321* (2013.01); *C23C 28/325* (2013.01); *C23C 28/34* (2013.01); *C23C 28/341* (2013.01); *C23C 28/345* (2013.01); *B32B 2307/412* (2013.01); *B32B 2307/50* (2013.01); *Y10T 428/12458* (2015.01); *Y10T 428/12576* (2015.01); *Y10T 428/12611* (2015.01); *Y10T 428/12618* (2015.01); *Y10T 428/12875* (2015.01); *Y10T 428/12882* (2015.01); *Y10T 428/12889* (2015.01); *Y10T 428/12896* (2015.01); *Y10T 428/12993* (2015.01)

(58) Field of Classification Search

CPC ........... B32B 3/266; B32B 3/30; B32B 7/023; B32B 15/04; B32B 15/043; B32B 15/08; B32B 15/09; B32B 3/26; B32B 15/085; B32B 27/302; B32B 27/304; B32B 27/32; B32B 27/36; B32B 27/365; B32B 2307/412; B32B 2307/50; Y10T 428/12611; Y10T 428/12618; Y10T 428/12576; Y10T 428/12875; Y10T 428/12882; Y10T 428/12889; Y10T 428/12896; Y10T 428/12993; Y10T 428/12458

See application file for complete search history.

(56) References Cited

U.S. PATENT DOCUMENTS

| | | | |
|---|---|---|---|
| 7,867,686 B2 | 1/2011 | Banach et al. | |
| 10,781,520 B2 | 9/2020 | Johansen et al. | |
| 2005/0184409 A1 | 8/2005 | Volkov et al. | |
| 2008/0173917 A1 | 7/2008 | Patz et al. | |
| 2011/0039042 A1* | 2/2011 | Johansen ................ | B32B 37/02 |
| | | | 428/463 |
| 2013/0003150 A1 | 1/2013 | Camus et al. | |
| 2014/0377517 A1* | 12/2014 | Johansen ................ | B32B 27/06 |
| | | | 428/209 |
| 2015/0037605 A1* | 2/2015 | Oser ................... | C03C 17/3663 |
| | | | 428/623 |
| 2018/0081265 A1 | 3/2018 | Singh | |
| 2018/0104975 A1 | 4/2018 | Nagano et al. | |
| 2018/0319703 A1* | 11/2018 | Boyum ................. | C23C 14/083 |

FOREIGN PATENT DOCUMENTS

| | | |
|---|---|---|
| KR | 20000057849 A | 9/2000 |
| WO | 2018022568 A1 | 2/2018 |

OTHER PUBLICATIONS

Kim in "Generation of Reflection Colors from Metal-Insulator-Metal Cavity Structure . . . ," in ACS Photonics 2019, 6, 2342-2349 Aug. 2019.*

Machine Translation, Lyu Jingbo et al., CN 111916252 A, Nov. 2020. (Year: 2020).*

Application No. PCT/US2022/053077, International Search Report and the Written Opinion, Mailed On Mar. 24, 2023, 8 pages.

EP22857094.1, "Office Action", Jul. 22, 2025, 6 pages.

\* cited by examiner

300

DEPOSIT A TRANSPARENT
TRANSITION LAYER — 302

DEPOSIT A METALLIC
LAYER — 304

APPLY A SECOND
SUBSTRATE — 306

METHOD OF MANUFACTURE OF PRECIOUS METAL LAMINATE

BACKGROUND OF THE INVENTION

Precious metals are used in various applications, including as a medium of exchange, as a collectible object of art, as an accounting unit, and as a store of value. However, due to the high monetary value of such metals, counterfeit objects from other less valuable materials may be produced and passed off as containing a particular precious metal. Additionally, it may be difficult to produce items that contain a precise amount of a given precious metal so as to be worth a particular value, especially in applications using very small quantities of the precious metal. During large scale production of such items, even small variations in the quantity of precious metals on single items may result in significant surpluses/deficits of metal used. Improvements in the precise applications of precious metals and in the security and anti-counterfeit measures are desired.

BRIEF SUMMARY OF THE INVENTION

In one embodiment, a precious metallic laminate is provided. The laminate may include a first transparent substrate. The laminate may include a transparent transition layer deposited on the first transparent substrate. The laminate may include a metallic layer deposited on the transparent transition layer. The metallic layer may include a precious metal. The laminate may include a second transparent substrate covering the metallic layer.

In some embodiments, an additional transparent transition layer may be disposed between the metallic layer and the second transparent substrate. The transparent transition layer may include one or both of a metallic oxide and a metallic carbide. The metallic layer may include a plurality of sublayers of a metal. At least some of the plurality of sublayers may have different thicknesses. At least some of the plurality of sublayers may have a variable thickness across one or both of a length and a width of the respective sublayer. At least one of the plurality of sublayers may have a concave shape across a width of the respective sublayer. At least one of the plurality of sublayers may have a convex shape across a width of the respective sublayer. At least a portion of the metallic layer has a thickness of less than about 200 nm. The laminate may include one or more identification markings. The one or more identification markings may include one or more selected from the group consisting of: a micropattern, a serial number, a portion of the metallic layer having a thickness of less than about 200 nm, a diffraction pattern device, a laser-etched element, a microdamage element, and a lithographic element.

In another embodiment, a method of producing a precious metallic laminate is provided. The method may include depositing a transparent transition layer on a first transparent substrate. The method may include depositing a metallic layer on the transparent transition layer. The metallic layer may include a precious metal. The method may include applying a second transparent substrate over the metallic layer.

In some embodiments, the method may include depositing an additional transparent transition layer on the metallic layer prior to applying the second transparent substrate. Depositing the metallic layer may include applying a plurality of sublayers of the precious metal atop the transparent transition layer. At least some of the plurality of sublayers may have a variable thickness across one or both of a length and a width of the respective sublayer. At least some of the plurality of sublayers may have different thicknesses. A thickest sublayer may be deposited most proximate the transparent transition layer. Depositing the metallic layer may include prior to depositing a last sublayer, measuring a total thickness of previous sublayers to determine a thickness of the last sublayer and depositing the last layer. The method may include prior to depositing the metallic layer, preparing the first transparent substrate by removing a portion of the first transparent substrate, dehydrogenating the first transparent substrate, cleaning the first transparent substrate, and removing oligomers from the first transparent substrate. The metallic layer may include a first portion having a thickness of at least about 200 nm and a second portion having a thickness of less than about 200 nm. A thickness of the metallic layer may be uniform to within 5%. The method may include trimming one or more lateral edges of the metallic layer.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a set of parentheses containing a second label that distinguishes among the similar components. If only the first reference label is used in the specification, the description is applicable to any one of the similar components having the same first reference label irrespective of the second reference label.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention are directed to precious metal laminate products and methods of manufacturing precious metal laminate products. In particular, embodiments are directed to precious metal laminate products that include very precise amounts of one or more precious metals. Embodiments may also include one or more features that provide anti-counterfeiting measures that may help users verify the authenticity of a given laminate product. The laminate products described herein are not limited to application and may be used, for example, as authentication objects, precise payment/value objects, art pieces, collectibles, and the like, although embodiments are not so limited.

Embodiments of the present invention include precious metals deposited and/or otherwise applied between transparent substrates. The transparent substrates may provide structure and protect the precious metal deposited therebetween, while still enabling the visual characteristics of the precious metal to be readily observable. In some embodiments, the precious metal may be deposited in a manner that enables the deposition pattern to form an authentication feature. In some embodiments, separate authentication features may be formed and/or applied to the precious metal laminate.

Figure 1:
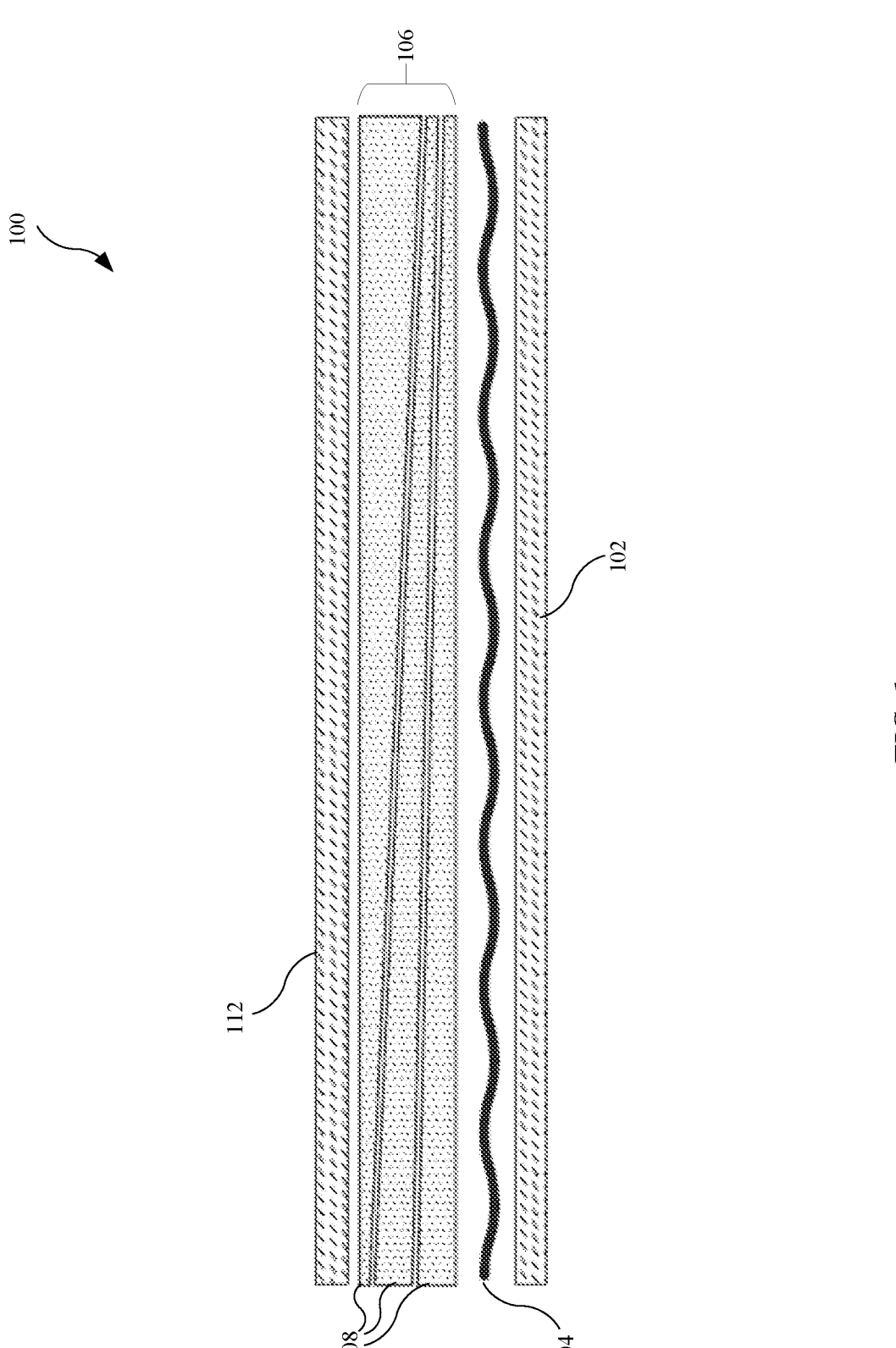
FIG. 1 illustrates an embodiment of a four layer precious metal laminate according to embodiments of the invention.

Turning now to FIG. 1, one example of a precious metal laminate 100 is illustrated. Laminate 100 may include a first substrate 102. The substrate 102 may have a length, width, and a thickness. The length and width may define outer boundaries of the laminate 100. The substrate 102 may be formed from polymeric and/or other transparent materials. For example, the substrate 102 may be formed from polyethylene terephthalate (PET), polyvinyl chloride (PVC), an acetate, a polycarbonate, a polyester, a polystyrene, a polypropylene, a polyethylene, polyvinylidene dichorlide (PVDC), other polymers, and/or combinations thereof. Oftentimes, the thickness of the substrate 102 may be between about 12 microns and 175 microns, more commonly between about 30 microns and 150 microns, although other thicknesses are possible in some embodiments. Thinner substrates may be more flexible, while thicker substrates may have greater mass and may therefore be able to withstand a greater heat load. In some embodiments, rather than being fully transparent, the substrate 102 may be translucent. In some embodiments, a dye or other coloring agent may be applied to at least partially color the substrate 102.

In some embodiments, some or all of a top/inward-facing surface of the substrate 102 may be processed and/or otherwise prepared prior to depositing and/or otherwise applying a subsequent layer of material to the top surface. For example, a portion of the top surface may be removed using a pretreat such as, but not limited to, plasma, sodium hydroxide, sputtering, etc. Hydrogen atoms may be blown off and/or oligomers may be removed. This processed surface may create better adhesion between the substrate 102 and subsequent layers.

The laminate 100 may include a transparent transition layer 104 disposed atop the substrate 102. For example, the transition layer 104 may be deposited and/or otherwise applied to the processed top surface of the substrate 102. The transition layer 104 may provide several benefits. For example, the transition layer 104 may enable a thinner substrate 102 to be utilized, while still providing stability to the laminate 100. The transition layer 104 may also help balance heat load during deposition processes, and may enable higher deposition rates without thermal damage to the substrate 102. In particular, the transition layer 104 may help increase the adhesion of precious metals to the substrate 102. As indicated above, the transition layer 104 may be transparent in order to enable the aesthetic properties of the precious metals to remain visible from an outside of the laminate 100. In some embodiments, the transition layer 104 may include one or more transition metals. Oftentimes, the transition metals may include oxides and/or carbides. For example, the transition layer 104 may include nickel alloys, titanium, vanadium, chromium, zirconium, niobium, molybdenum, hafnium, tantalum, tungsten, nickel chromium alloys, titanium carbide, titanium oxide, and/or titanium zirconium. Oftentimes, the transition layer 104 may have a thickness of between about 0.5 nm and 10 nm.

One or more metallic layers 106 may be deposited and/or otherwise applied to the substrate 102 and/or transition layer 104. The metallic layer 106 may include one or more precious metals. For example, the metallic layer 106 may include gold, silver, platinum, palladium, rhodium, osmium, iridium, ruthenium, rhenium, indium, germanium, beryllium, tellurium, bismuth, and/or other metals. It will be appreciated that the precious metals may be present in substantially pure form (greater than 90%, greater than 95%, greater than 97%, greater than 98%, greater than 99%, etc.), while in other embodiments, less pure forms of the precious metals may be utilized. For example, 14 carat gold (or other purity level) may be used in some embodiments. The metallic layer 106 may be applied as a precisely measured quantity of one or more precious metals. For example, a quantity of precious metal deposited and/or otherwise applied may be measured by mass and/or thickness. In specific examples, the precious metal may be present in quantities of between about 25 mg to 2520 mg. In some embodiments, each layer of the precious metal may be applied at thicknesses of between about 96 nm and 8000 nm and more commonly between about 200 nm and 6000 nm.

Oftentimes, the metallic layer 106 may be applied as a number of sublayers 108, which may increase the precision of the application process, as well as enable more intricate designs of the precious metal. Any number of sublayers 108 may be present within the laminate 100. In some embodiments, each of the sublayers 108 may have a same thickness, while in other embodiments, one or more of the sublayers 108 may have different thicknesses. For example, lower (first-applied) sublayers 108 may be applied at greater thicknesses than upper (later-applied) sublayers 108. Such an arrangement may be particularly useful, as this may allow the later-applied sublayers 108 to be thinner, more precisely controlled layers that may enable a total thickness of the sublayers 108 to be carefully controlled to ensure that a substantially precise amount of precious metal is applied to the laminate 100. It will be appreciated that thicker layers may be applied as upper layers in some embodiments. Additionally, some embodiments may have sublayers 108 that are arranged in any order in relation to thickness of each sublayer 108. In some embodiments, a substantially precise amount of precious metal is within about 20% of a desired target amount (such as a thickness and/or mass), within about 15% of the desired target amount, within about 10% of the desired target amount, within about 7.5% of the desired target amount, within about 5% of the desired target amount, within about 4% of the desired target amount, within about 3% of the desired target amount, within about 2% of the desired target amount, within about 1% of the desired target amount, within about 0.9% of the desired target amount, within about 0.8% of the desired target amount, within about 0.7% of the desired target amount, within about 0.6% of the desired target amount, within about 0.5% of the desired target amount, within about 0.4% of the desired target amount, within about 0.3% of the desired target amount, within about 0.2% of the desired target amount, within about 0.1% of the desired target amount, within about 0.05% of the desired target amount, or less.

In some embodiments in which the metallic layer 106 is generally flat, the metallic layer 106 may have a thickness that is uniform across a surface area of the metallic layer 106 to within 15%, within 10%, within 5%, within 3%, within 2%, within 1%, within 0.5%, within 0.025%, within 0.01% or less.

In some embodiments, to enable the precise application of the precious metal layer 106, a number of sublayers 108 may be applied, with a total thickness of these sublayers 108 may be measured prior to the application of one or more final sublayers 108. Based on the measured thickness, a thickness of the one or more final sublayers 108 may be determined to achieve a desired total amount of the precious metal. The one or more final sublayers 108 may then be applied to the prior-applied sublayers 108 to create a metallic layer 106 having a desired thickness and/or cross-sectional shape.

In some embodiments, the sublayers 108 may be generally flat and/or uniform, however in other embodiments, one or more of the sublayers 108 may have a non-flat shape and/or be otherwise non-uniform across a length and/or width of the sublayer 108. For example, as shown in FIG. 1, three sublayers 108 form the metallic layer 106, with the first two sublayers 108 tapering from a thickest portion to a thinnest portion (from left to right) and a thicker top sublayer 108 tapering from a thinnest portion to a thickest portion. As illustrated, a tapered thickness of the top sublayer 108 mirrors the combined taper of the first two sublayers 108, enabling the three sublayers 108 to form a generally flat metallic layer 106. In some embodiments, each of the sublayers 108 may include a same amount of precious metal, while in other embodiments, one or more of the sublayers 108 may have more or less precious metal than other layers. In some embodiments with one or more tapering sublayers 108, sublayers 108 having different directions of taper may be arranged together, alternate, and/or provided in another arrangement. In some embodiments, the taper may be constant, while in other embodiments the taper may be curved and/or otherwise variable. Additionally, in some embodiments one or more of the sublayers 108 may be flat and/or otherwise shaped. The arrangement of sublayers 108 may create a generally flat metallic layer 106, or may produce a metallic layer with one or more raised and/or lowered areas.

In some embodiments, one or more lateral edges of the metallic layer 106 may have different thicknesses across a width and/or length of the metallic layer 106. For example, due to the deposition processes used, a thickness of the metallic layer 106 may be lower proximate the lateral edges (such as due to some overspray and/or other non-uniformities). To provide a substantially uniform metallic layer 106, lateral edges that include these thinner regions may be trimmed, leaving behind a metallic layer 106 of substantially uniform thickness. The area and thickness of the remaining metallic layer 106 may be carefully controlled to provide the desired target amount of the precious metal. The trimmed metal may be then recycled. The metallic layer 106 may be trimmed separately from the substrate 102, transition layer 104 and/or other layers in some embodiments. In other embodiments, the substrate 102, transition layer 104 and/or other layers may be trimmed along with the metallic layer 106. For example, each layer of the laminate 100 may have a slightly larger area than the finished laminate 100 such that trimming of the various layers results in a laminate 100 of a desired size.

Figure 1A:
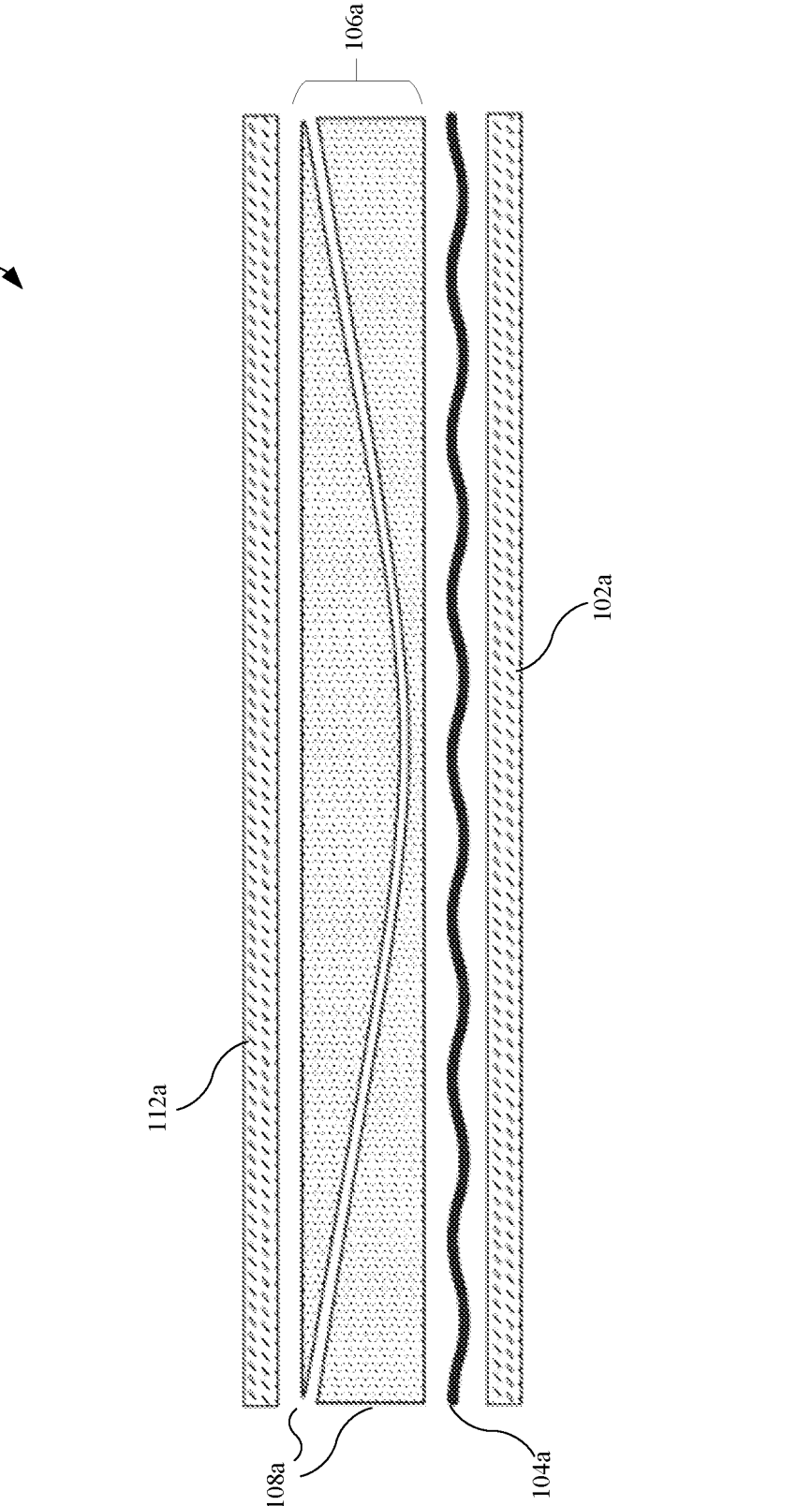
FIG. 1A illustrates an embodiment of a four layer precious metal laminate according to embodiments of the invention.

For example, FIG. 1A illustrates a laminate 100a having a metallic layer 106a formed from multiple curved sublayers 108a. As illustrated, a bottom sublayer 108a may have a generally flat bottom surface that matches the surface of substrate 102a and/or transition layer 104a. A top surface of the bottom sublayer 108a may have a concave shape. For example, the top surface of the bottom sublayer 108a may taper downward to a middle of the bottom sublayer 108a. The degree of taper may be constant and/or variable. As illustrated, the top surface of the bottom sublayer 108a has a variable degree of taper to create a curved downward sloping surface toward a middle of the bottom sublayer 108a. A top sublayer 108a may have a bottom surface that has a convex shape that matches the concave shape of the top surface of the bottom sublayer 108a such that the combined top and bottom sublayers 108a create a generally flat or planar metallic layer 106a. For example, as illustrated, the bottom surface of the top sublayer 108a has a domed shape that is sized and shaped to generally match the concave indentation of the bottom sublayer 108a. While shown with only two sublayers 108a, it will be appreciated that any number of sublayers 108a may be provided in some embodiments. Additionally, any orientation of sublayers 108a may be utilized. For example, the bottom sublayer 108a may be applied as an upward-facing convex dome shape, with the top sublayer 108a having a corresponding concave pattern.

While shown with the various convex and/or concave portions being generally symmetrical, embodiments may include asymmetrical sublayers 108. In some embodiments, a single sublayer 108 may include flat/planar portions, tapered portions, and/or concave/convex portions. Some embodiments, multiple concave and/or convex portions may be provided in a single sublayer 108. In some embodiments, the metallic layer 106 may include any combination of flat/planar sublayers 108, tapered sublayers 108, concave/convex sublayers 108, and/or sublayers 108 of other shapes. While shown with sublayers 108 that create a flat metallic layer 106, it will be appreciated that the combination of sublayers 108 may create a metallic layer 106 with a variable cross-sectional shape. For example, the metallic layer 106 may have a thickness gradient, which may occur within a medial portion of the metallic layer 106 and/or near the periphery of the metallic layer 106. A thickness of the metallic layer may vary monotonically along one or more axes of the metallic layer 106 and/or the thickness may vary in a curvilinear manner.

The various sublayers 108 may be coextensive with one another, while in other embodiments, one or more of the sublayers 108 may extend beyond the outer peripheries of one or more other sublayers 108. In some embodiments, one or more (possibly all) sublayers 108 may define gaps within an interior of the given sublayer 108. This may create a portion of the metallic layer 106 that is thinner than a remaining portion or that is entirely devoid of precious metal to create a transparent or translucent window. In some embodiments, if the thin portion is sufficiently thin, the thin portion may serve as an authentication feature. As just one example, if the precious metal is gold and the thin portion is less than about 200 nm in thickness, the gold may appear turquoise when light is shined through the thin portion. This particular optical transmission feature is unique to gold and may enable users to quickly discern whether the laminate actually contains gold, rather than some counterfeit material, as this is a very difficult property to replicate, even with the use of dyes. These thin portions may be of any shape and/or size. In some embodiments, these thin portions may be used to generate intricate designs. As just one example, thin areas in different sublayers 108 (or a single sublayer 108) may be deposited to form an image. This image may have unique optical properties that serve as an authentication measure and/or provide a unique aesthetic quality. In one particular embodiment, the thin portions may define a clover design, with each of the leaves being translucent. As noted above, if the translucent portions are gold, the leaves may look turquoise as lighted is shined through the clover. In some embodiments, a thickness of one or more of the leaves may be different, which may provide unique light transmission properties through the different leaves.

In some embodiments, the sublayers 108 may have different shaped profiles along different axes of the laminate 100. For example, along a length of the laminate 100, one or more of the sublayers 108 may have a tapered profile, such as seen in FIG. 1, while along a length of the laminate 100, one or more of the sublayers 108 may have a concave/convex profile. In some embodiments, a single sublayer 108 may have two different profile shapes along different axes, such that when viewed from the side the sublayer 108 may have a first shape and when viewed from an end the sublayer 108 may have a second shape. Embodiments may therefore have sublayers 108 that have very complex deposition (or other application) patterns. In some embodiments, boundary lines of the various sublayers 108 may be visible to the naked eye, while in other embodiments the sublayer boundaries may be invisible without the aid of magnifying implements. In some embodiments, a marker material may be used to distinguish between the different sublayers.

While shown with one metallic layer, it will be appreciated that multiple metallic layers may be used in some embodiments. For example, a second metallic layer 106 may be deposited and/or otherwise applied atop a first metallic layer 106. In some embodiments, the first metallic layer 106 and the second metallic layer 106 may include the same precious metal. In other embodiments the two layers may include different precious metals. In such embodiments, visual characteristics of each metallic layer 106 may be viewed from one side of the laminate 100. For example, the first metallic layer 106 may be gold, while the second metallic layer 106 may be silver. When viewed from a first side of the laminate 100, the first metallic layer 106 may be visible, making the laminate 100 appear gold in color. When viewed from the opposite side of the laminate 100, the second metallic layer 106 may be visible, making the laminate appear silver in color. It will be appreciated that in some embodiments, one or more of the metallic layers 106 may be formed of a non-precious metal or alloy, such as aluminum, bronze, copper, nickel, cobalt, titanium, lanthanides, etc.

The metallic layer 106 may include different textures and/or finishes. For example, the metallic layer 106 may have a polished finish to increase the shine and/or reflective properties of the precious metal. Various finishes may include antique finishes, brushed finishes, hammered finishes, satin finishes, and/or oil-rubbed finishes. Various textures may include grooves, diffraction gratings, and the like. Additionally, various textures may be applied to the metallic layer 106. In some embodiments, an entire outer/exposed surface of the metallic layer 106 may have a single surface finish/texture, while in other embodiments one or more portions of the exposed surface of the metallic layer 106 may have different finishes/textures. For example, a first major surface (such as the bottom surface) of the metallic layer 106 may have a first finish/texture while a second opposite major surface (such as the top surface) may have a second, different finish/texture. Additionally, in some embodiments, multiple portions of the metallic layer 106 on a single major surface may have different surface textures/finishes. This may be particularly useful in embodiments in which a portion of the metallic layer 106 is used to define a shape, text, and/or other image for security, aesthetic, and/or other purposes. For example, a main portion of the surface of the metallic layer 106 may have a first surface finish/texture, while a smaller portion of the surface having a desired shape, text, and/or other image may have a different surface finish/texture. This may enable the smaller portion to be easily distinguished from the main portion.

In some embodiments, the metallic layer 106 may include feathering, such as near the edges of one or more of the sublayers 108. The feathering may be a lateral reduction of the thickness of the metallic layer 106 and/or one or more of the sublayers 108. This may be used to create precisely thinned regions, which may provide unique optical characteristics, such as those described above. The use of feathering may create a laminate that is particularly difficult to counterfeit. In some embodiments, the feathering may have an optical density ranging from 1 to 4. In some embodiments, a dielectric material may be printed on or otherwise deposited on a portion of the metallic layer 106. The dielectric material may have a thickness that is between 0.25 to 1.5 of a quarter wave thickness. The thickness may be selected to produce various colors when light is reflected off of the dielectric material.

In some embodiments, the laminate 100 may include a second substrate 112 that covers the metallic layer 106. Substrate 112 may be particularly useful in embodiments in which the precious metal is a soft metal, as the substrate 112 may help protect the metallic layer 106 from damage associated with handling, misuse, and/or exposure to the environment. This may be particularly useful when non-precious metals are included, such as copper, brass, nickel, etc., which may be subject to oxidization. The substrate 112 may also be particularly useful when other materials (including precious metals such as silver) are included that may be subject to oxidation. The substrate 112 may be identical to or similar to the substrate 102. In other embodiments, the substrate 112 may be different from the substrate 102. In some embodiments, the substrate 112 may be formed of a same or similar material as substrate 102. For example, the substrate 112 may include polyethylene terephthalate (PET), polyvinyl chloride (PVC), an acetate, a polycarbonate, a polyester, a polystyrene, a polypropylene, a polyethylene, polyvinylidene dichorlide (PVDC), other polymers, and/or combinations thereof. Oftentimes, the substrate 112 may have a thickness of between about 12 microns and 175 microns.

Figure 2:
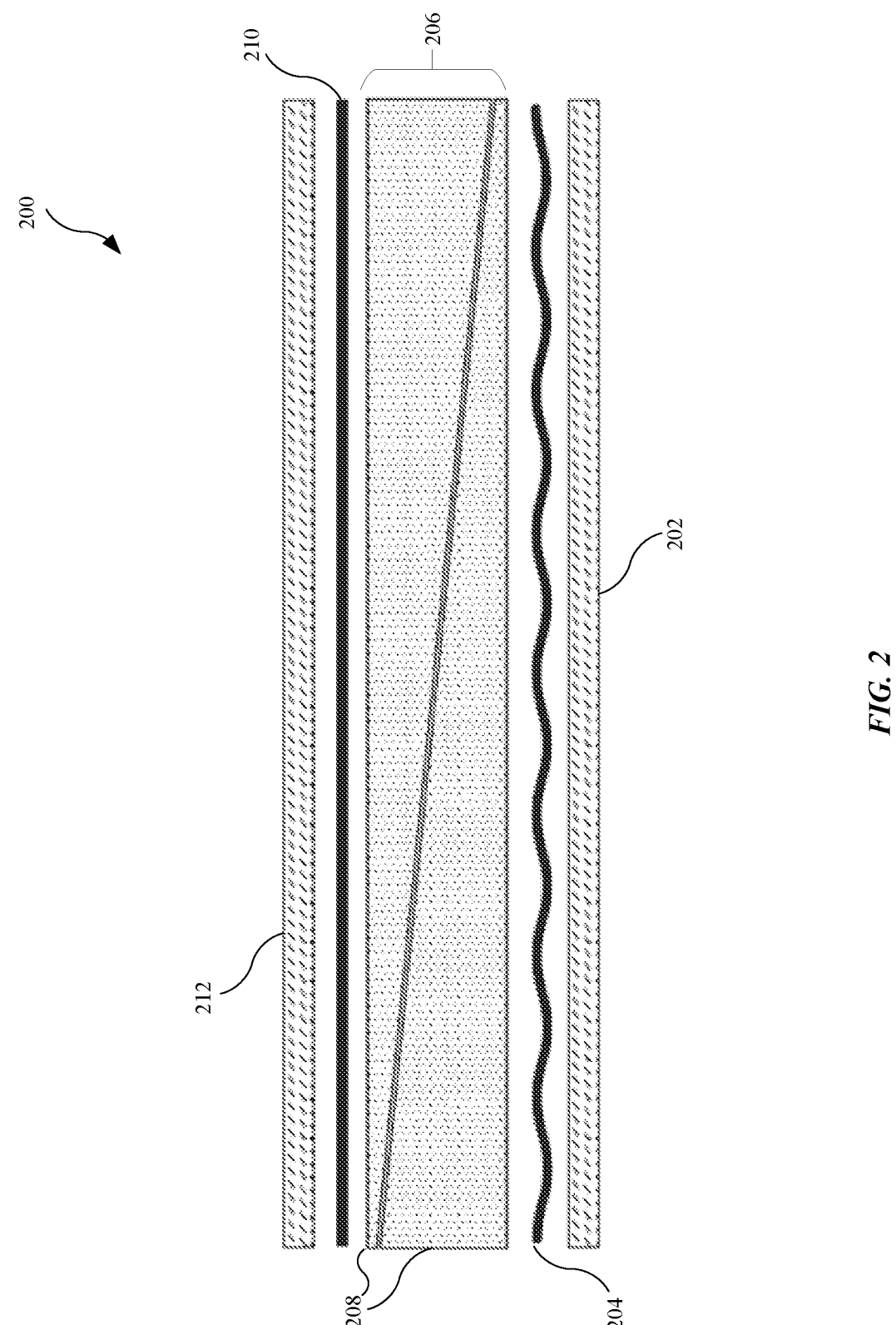
FIG. 2 illustrates an embodiment of a five layer precious metal laminate according to embodiments of the invention.
Figure 2A:
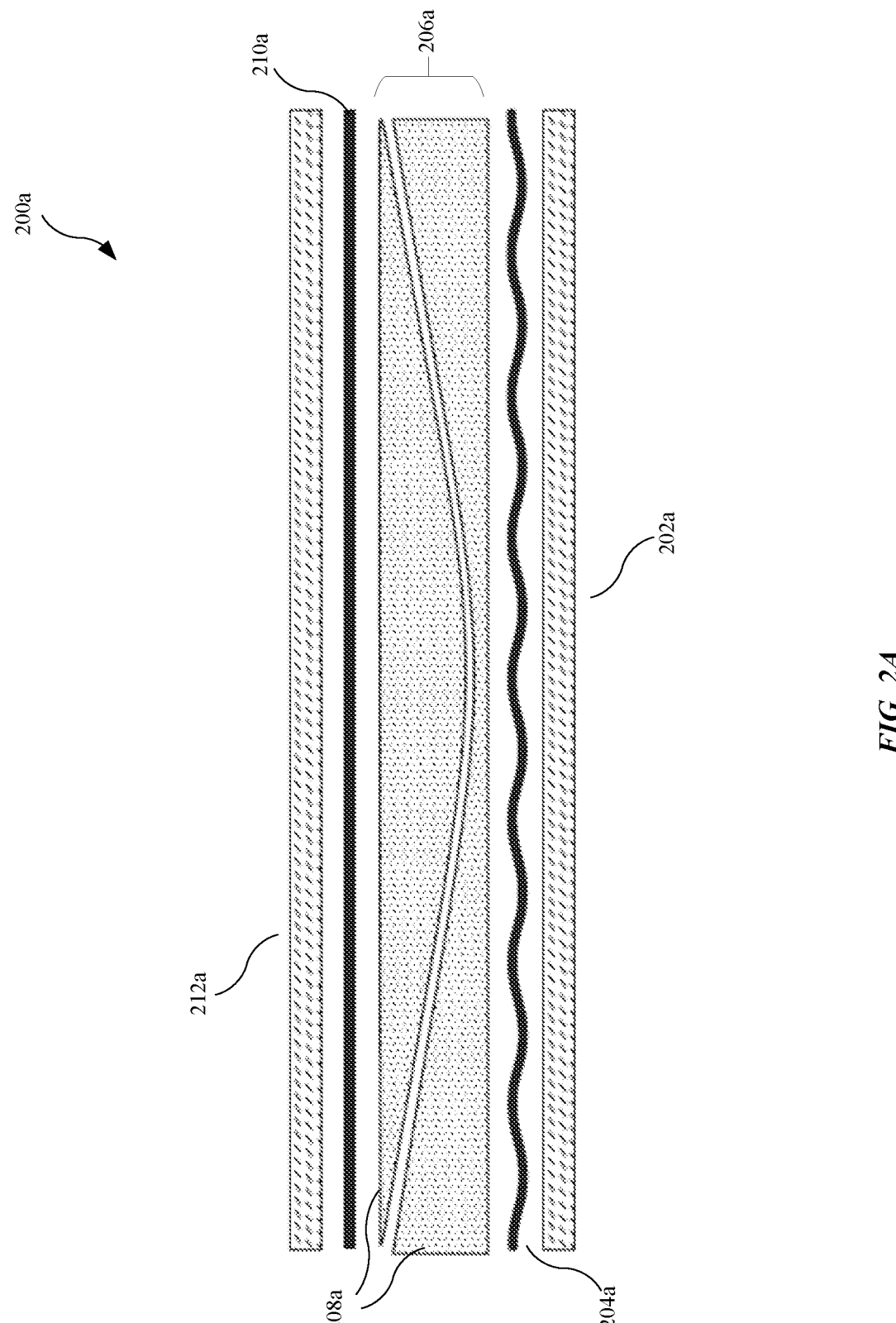
FIG. 2A illustrates an embodiment of a five layer precious metal laminate according to embodiments of the invention.

In some embodiments, such as shown in FIGS. 1 and 1A, the substrate 112 (and 112a) may be applied directly to the metallic layer 106. However, in other embodiments, an additional transition layer may be formed between the metallic layer and the substrate 112. FIGS. 2 and 2A illustrate one such example of a laminate 200/200a. Laminate 200/200a may include a first substrate 202/202a, transition layer 204/204a, metallic layer 206/206a (which may be formed of a number of sublayers 208/208a), and a substrate 212/212a, which may be similar to the corresponding features of FIGS. 1 and 1A described above. The laminate 200/200a may also include a transition layer 210/210a that is applied between the metallic layer 206/206a and the substrate 212/212a. The transition layer 210/210a may be similar to the transition layer 104/104a described above. For example, the transition layer 210/210a may include one or more transition metals. Oftentimes, the transition metals may include oxides and/or carbides. For example, the transition layer 210/210a may include titanium carbide, titanium oxide, and/or titanium zirconium.

In some embodiments, some or all of a bottom/inward-facing surface of the second substrate may be processed and/or otherwise prepared prior to being deposited and/or otherwise applied to the transition layer 210/210a and/or the metallic layer 106/206. For example, a portion of the bottom surface may be removed using a pretreat such as, but not limited to, plasma, sodium hydroxide, sputtering, etc. The surface may be dehydrogenated to removed hydrogen atoms and/or oligomers may be removed. This processed surface may create better adhesion between the substrate 112/212 and prior layers.

Figure 2B:
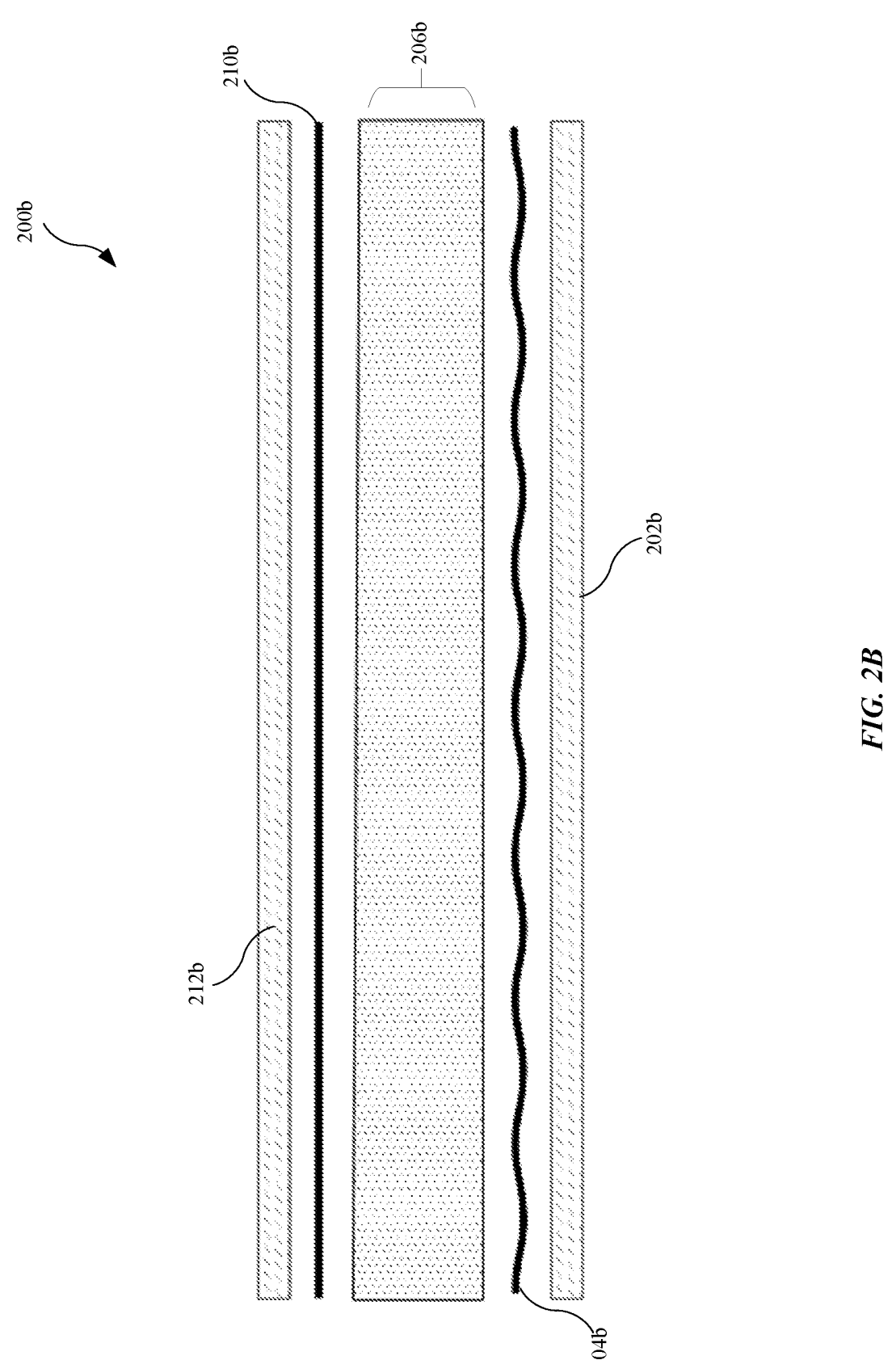
FIG. 2B illustrates an embodiment of a five layer precious metal laminate according to embodiments of the invention.

While illustrated with having each metallic layer being formed from a number of sublayers, some embodiments of laminates may include metallic layers that are applied in a single pass. FIG. 2B illustrates one such laminate 200b. Laminate 200b may be similar to laminates 100, 200, and 200a and may include a first substrate 202b, a transition layer 204b, a metallic layer 206b, a transition layer 210b, and a second substrate 212b. As illustrated, the metallic layer 206b may be deposited in a single pass and/or may be formed without distinguishable boundaries between any sublayers such that the metallic layer 206b forms a monolithic structure. Oftentimes, a thickness of the metallic layer 206b may be uniform across a surface area of the metallic layer 206b to within 15%, within 10%, within 5%, within 3%, within 2%, within 1%, within 0.5%, within 0.025%, within 0.01% or less. In other embodiments, a thickness of the metallic layer 206b may vary across the area of the metallic layer 206b such that there are one or more contours, tapers, and/or steps in the thickness of the metallic layer 206b.

In some embodiments, the laminates described herein may be rectangular or generally rectangular in shape, however the laminate may be any shape in various embodiments. In some embodiments, peripheral edges of one or both of the substrates may define the outer boundaries of the laminate, while in other embodiments one or more of the other layers may define the boundaries of the laminate. In some embodiments, all of the layers of the laminate may be coextensive with one another, while in other embodiments, one or more layers may be inward of and/or extend beyond the peripheral edges of one or more of the other layers in one or more directions. In a particular embodiment, peripheral edges of one or both of the substrates may extend beyond peripheral edges of the inner layers of the laminate, which may fully protect the internal layers, as well as create a transparent border about the inner layers.

While shown as having four or five layers, it will be appreciated that in some embodiments a laminate may include any number of additional layers. For example, additional metallic layers, substrates, security layers, and/or other layers may be included in the laminate. The laminate may typically have a thickness of between about 50 microns and 300 microns (and more commonly between about 100 microns and 200 microns), which, in some embodiments, may vary across an area of the laminate.

In some embodiments, the laminates described herein may include one or more text-based and/or image-based markings that may serve as identifying marks and/or security features. In some embodiments, the markings may include one or more micro patterns, embossed areas, relief structures, holograms, laser-etched elements, lithographs, and/or diffraction gratings. In some embodiments, the markings may provide identification of one or more pieces of information, such as a source of the laminate, a type of precious metal in the laminate, a purity of precious metal in the laminate, an amount of precious metal in the laminate, a value of the laminate, a serial number of the laminate, and/or other information.

In some embodiments, the markings may include various security features including small/trace quantities of a metal (different than the metal in the metallic layer), embedded fibers, a dye coating (which may be fluorescent in some embodiments), a spectral-shifting coating or other treatment, particles (such as nanoparticles) having relatively unique spectral properties. The security features may include a thin plastic material that includes a laminate of other substances and/or coatings which have color shift or other selected optical and/or electromagnetic properties.

In some embodiments, the markings may include a number of apertures formed through the laminate, one or more blind holes formed through a portion of the thickness of the laminate, one or more microscopic elements (e.g., micro-damage elements such as a contaminant distribution arrangements, microscopic projective impact detection elements, depressions, and/or bas-relief surfaces). In some embodiments, all of the markings and/or other security features may be provided on a single layer of the laminate, such as the metallic layer and/or one of the substrate layers. In other embodiments, the markings and/or other security features may be provided on multiple layers. In some embodiments, one or more of the markings and/or other security features may be provided as a separate layer of material within the laminate.

In some embodiments, the laminate may include one or more textured outer surfaces. For example, one or both of the substrate layers may be applied and/or formed to include a textured surface, such as a grooved, bumpy, embossed features and/or other textured surface. In some embodiments, the metallic layer may be applied to form the texture of the laminate such that when one or both of the substrates are affixed with the metallic layer, the texture of the metallic layer is imparted on the respective substrate.

Figure 3:
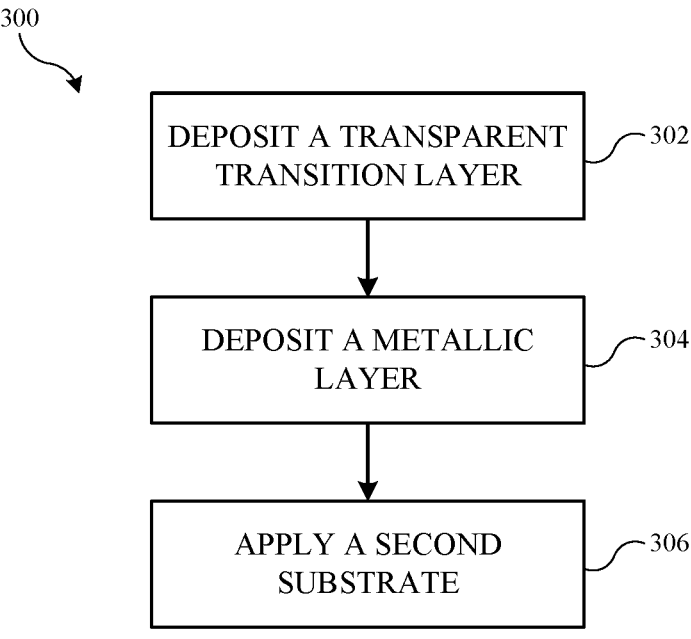
FIG. 3 is a flowchart depicting a process for manufacturing a precious metal laminate according to embodiments of the invention.

FIG. 3 illustrates one embodiment of a process 300 for manufacturing a laminate. Process 300 may be used to form laminates such as laminates 100 and 200 described herein. Process 300 may begin at operation 302 by depositing a transition layer on a first transparent substrate. For example, a transition layer containing a transition metal, such as an oxide and/or carbide, may be deposited and/or otherwise applied to a substrate. For example, the transition layer may be sputtered, deposited via evaporation, ion plated, chemical vapor deposited, and/or otherwise applied to the substrate. The substrate may oftentimes be formed of a transparent or translucent polymer. In some embodiments, prior to applying the transition layer to the substrate, the substrate may be processed and/or otherwise prepared to increase the adhesion between the substrate and subsequently-applied layers. For example, the processing steps may include removing a portion of the first transparent substrate, removing hydrogen atoms from the first transparent substrate via dehydrogenation, cleaning the first transparent substrate, and/or removing oligomers from the first transparent substrate. In some embodiments, the substrate may be corona treated to increase adhesion.

At operation 304, a metallic layer may be deposited and/or otherwise applied on the transparent transition layer. The metallic layer may include at least one precious metal. In some embodiments, the metallic layer may be applied using sputter deposition, such as ion-beam sputtering, reactive sputtering, ion-assisted deposition, high-target-utilization sputtering, high-power impulse magnetron sputtering, and/or gas flow sputtering. In some embodiments, the metallic layer may be applied via electroplating, colloidal deposition (and subsequent removal of a colloidal suspension liquid via application of heat and/or vacuum and/or densification by heat and/or pressure), adhesive lamination of metallic leaf, physical-vapor deposition, atomic layering, vacuum deposition, and/or other deposition process.

In some embodiments, depositing the metallic layer may include applying a number of sublayers of the precious metal atop the transparent transition layer. For example, the precious metal may be applied using a number of deposition steps that may enable greater control and precision of the amount and pattern of precious metal provided within the laminate. In some embodiments, the sublayers may all be applied using a single type of deposition process, while in other embodiments, multiple types of deposition processes may be used to deposit the sublayers. For example, the first sublayers may be deposited using a first method, while the final sublayers are deposited using a second method, which, in some embodiments, may be a more precise deposition method than the first. As just one example, the first sublayers may be deposited using evaporative deposition, while the final sublayers are deposited using sputtering. In some embodiments, each of the sublayers may have a same shape and/or thickness, while in other embodiments one or more of the sublayers may have different shapes and/or thicknesses. For example, in some embodiments, earlier-applied sublayers (closer to the substrate and/or transition layer) may be thicker than one of more of the last-applied sublayers. This may be particularly advantageous as it allows a bulk of the precious metal to be deposited rather quickly, with the last portion of the precious metal to be carefully deposited to provide a precious amount of total precious metal within the laminate. Additionally, the use of thinner sublayer passes when depositing thicker metallic layers, as depositing thicker sublayers may cause melting and/or over-depositing. As just one example, the process 300 may include, prior to depositing the last sublayer (or multiple last sublayers), measuring a total thickness of previous sublayers to determine a thickness of the last sublayer (or number of last sublayers). For example, the final sublayer thickness may be based on a difference between the measured thickness of the previous sublayers and a desired total thickness of the metallic layer. The last sublayer (or multiple last sublayers) may then be deposited at the desired thickness. In some embodiments, rather than measuring the previous sublayers, the deposition process may be predefined to deposit a number of sublayers of a desired thickness (constant and/or variable) and/or shape to achieve a metallic layer of a desired shape and/or thickness. The shape and/or thickness of each of the sublayers may be the same or different. In some embodiments, one or more of the sublayers may be non-planar. In such embodiments, the last sublayer may be applied with variable thickness to produce a generally planar metallic layer. In other embodiments, the last sublayer may be applied with a flat and/or variable thickness to produce a non-planar metallic layer. In some embodiments, to adjust the thickness and/or profile shape of a sublayer, a speed of a cathode (or other deposition tool), a power supplied to the cathode(s), a web speed of the film, gas delivery parameters, and/or power supplied to the deposition tool may be altered.

In some embodiments, the sublayers may have a tapered and/or curved profile across a width and/or length of the sublayers as described herein. For example, one or more of the sublayers may have a first profile in a machine direction and a second profile in a cross-machine direction. As just one example, one or more of the sublayers may have a tapered profile in the machine direction, while one or more of the sublayers may have a concave and/or convex profile in the cross-machine direction. It will be appreciated that any shape and/or combination of shapes of profiles may be provided in one or more sublayer of the metallic layer. Each outer surface of the metallic layer may have a same or different surface finish and/or texture which may be applied before and/or after the metallic layer is applied to the substrate.

In some embodiments, the process 300 may also include feathering a portion of the metallic layer. This feathering may create thinner areas within the metallic layer and/or otherwise create areas with unique optical properties, which may be used as security features that can be used to verify the authenticity of the laminate. The feathered areas may have an optical density of between about 1 and 4 and may be translucent and/or reflective. In some embodiments, the feathering may be done by first spraying and/or otherwise applying a substance (such as oil and/or ink) on a portion of the substrate. In some embodiments, the substance may be selected to evaporate in vacuum. As the metallic layer is deposited on the substrate, feathered shadows may be created at locations of the substance. In some embodiments, feathering may be applied by placing a heat-resistant object between a sputtering target and the substrate and then sputtering the metallic layer onto the substrate, which may cause feathering in the form of a shadow. In some embodiments, the heat-resistant object may be moved in a predetermined and/or random pattern, which may cause the shadowing/feathering to vary based on the movement of the heat-resistant object. In some embodiments, the moving object may move at a constant rate, which may result in a shadow of generally uniform appearance/thickness. In other embodiments, the moving object may move at a variable rate and/or pause at one or more locations, which may result in a shadow of variable thickness and/or otherwise non-uniform shadow. In some embodiments, the feathering may be created by mechanically scratching, chemically etching, and/or laser etching a portion of the metallic layer and/or one or more sublayers.

In some embodiments, the deposition process may create a feathered and/or otherwise thinned portion without the use of other substances. For example, the deposition process may involve depositing a thinner portion of precious metal on one or more areas (which may extend through one or more sublayers), creating a gap in one or more sublayers, and/or otherwise depositing the precious metal in a manner in which a thinned or feathered portion is provided. In some embodiments, the feathered area may be a random shape or pattern, while in other embodiments, the feathered area may be a predefined shape and/or textual message, such as a clover such as described above. In some embodiments, the feathered portion may be in only one sublayer and/or a subset of sublayers of the metallic layer. In some embodiments, in which the feathered portion is formed in only some of the sublayers, masking steps using inks, oils, heat-resistant objects, etc., may be performed by placing such materials on the substrate and/or on one of more previously applied sublayers. In some embodiments, a thickness of the feathered portion may be less than about 200 nm, while a thickness of the remaining portion of the metallic layer is greater than about 200 nm.

In some embodiments, additional processing may be performed on one or more of the layers of the laminate to produce various optical effects that may serve as markings, aesthetic features, and/or security features. As just one example, a dielectric material may be printed on or otherwise deposited on a portion of the metallic layer. The dielectric material may have a thickness that is between 0.25 to 1.5 of a quarter wave thickness. The thickness may be selected to produce various colors when light is reflected off of the dielectric material.

In some embodiments, a second metallic layer may be deposited and/or otherwise applied atop the metallic layer (directly or with one or more intervening layers). In some embodiments, the second metallic layer may be formed from the same metal and/or a different metal than the initial metallic layer. The second metallic layer may include one or more precious and/or non-precious metals. In some embodiments, an outer surface (facing away from the first metallic layer) of the second metallic layer may have a same or different surface finish and/or texture as an outer surface of the first metallic layer.

Process 300 may include applying a second transparent substrate over the metallic layer at operation 306. The second substrate may be identical to the first substrate in some embodiments, while in other embodiments, the second substrate may be formed from a different material, a different color, a different thickness, and/or have other distinct properties. In a particular embodiment, the second substrate may be formed from a protective lacquer that is applied over the inner layers of the laminate. In some embodiments, the second transparent substrate may be applied directly to the metallic layer. In other embodiments, a second transition layer may be disposed between the metallic layer and the second substrate. In some embodiments, prior to applying the second substrate to the transition layer and/or the metallic layer, the second substrate may be processed and/or otherwise prepared to increase the adhesion between the second substrate and the previously-applied layers. For example, the processing steps may include removing a portion of the second substrate, dehydrogenation of the surface of the second substrate, cleaning the second substrate, and/or removing oligomers from the second substrate. In some embodiments, the second substrate may be applied to the second transition layer and/or the metallic layer using adhesive lamination. In embodiments in which the metallic layer is textured, feathered, and/or otherwise has a variable thickness, the second substrate may be applied with a constant thickness, which may result in the texture and/or other contour being passed through to the second substrate (and subsequently, the laminate). In other embodiments, the second substrate may be applied with a variable thickness so as to fill in voids formed by the texture and/or profile of the metallic layer and impart a planar outer surface to the second substrate and laminate.

In some embodiments, the laminate may include one or more markings, which may convey information associated with the laminate, serve as aesthetic features, and/or provide security features. For example, the markings may indicate a source of the laminate, a type of precious metal in the laminate, a purity of precious metal in the laminate, an amount of precious metal in the laminate, a value of the laminate, a serial number of the laminate, and/or other information. In some embodiments, the markings may be applied by printing textual and/or image-based information on at least one of the substrates and/or metallic layer(s), holographically embossing at least one of the substrates and/or metallic layer(s), and/or may be provided as separate layers. For example, in some embodiments, the substrate may be printed with one or more text-based and/or image-based markings. The printing may be done by applying a substance such as ink to the substrate and/or by indenting and/or embossing the markings onto the substrate. In some embodiments, the markings may be 3D printed onto the substrate. The markings may be applied prior to, during, and/or after the various layers are assembled. One or more of the markings may be of constant and/or variable thickness and/or may have different optical densities.

In some embodiments, such as those in which the markings convey information about the source, validity, or content of the laminate, a database may be maintained having the data associated with each laminate produced. For example, each laminate may be prepared with one or more markings. An electronic record of the markings of each laminate may be produced. For example, an identifier of each laminate, such as a serial number, may be associated with one or more other pieces of data of the respective laminate. For example, each serial number may be associated with a source of the laminate, a type of precious metal in the laminate, a purity of precious metal in the laminate an amount of precious metal in the laminate, a value of the laminate, and/or other information associated with a laminate. This record may be stored such that the information provided on a given laminate can be compared to the stored record to verify the authenticity of the laminate.

In some embodiments, multiple laminates may be secured together to form a thicker laminate. For example, two or more laminates may be laminated and/or otherwise secured to one another such that the laminates are generally coextensive with one another.

The methods, systems, and devices discussed above are examples. Some embodiments were described as processes depicted as flow diagrams or block diagrams. Although each may describe the operations as a sequential process, many of the operations can be performed in parallel or concurrently. In addition, the order of the operations may be rearranged. A process may have additional steps not included in the figure. It will be further appreciated that all testing methods described here may be based on the testing standards in use at the time of filing or those developed after filing.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate to in the context of the systems, devices, circuits, methods, and other implementations described herein.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

What is claimed is:

1. A method of producing a precious metallic laminate, comprising:

depositing a transparent transition layer on a first transparent substrate;

depositing a metallic layer on the transparent transition layer by:

applying a plurality of sublayers of at least one precious metal atop the transparent transition layer;

prior to depositing a last sublayer, measuring a total thickness of previous sublayers to determine a thickness of the last sublayer needed to achieve a target mass of the at least one precious metal; and depositing the last sublayer, wherein:

the at least one precious metal is selected from the group consisting of gold, silver, platinum, palladium, rhodium, osmium, iridium, ruthenium, rhenium, indium, germanium, beryllium, tellurium, and bismuth;

at least two sublayers of the plurality of sublayers are adjacent to one another;

at least some of the plurality of sublayers have different thicknesses;

a collective mass of the at least one precious metal within the plurality of sublayers is within 10% of the target mass of the at least one precious metal; and the transparent transition layer contacts at least a portion of the first transparent substrate and at least a portion of the metallic layer; and applying a second transparent substrate over the metallic layer.

2. The method of producing a precious metallic laminate of claim 1, further comprising:

depositing an additional transparent transition layer on the metallic layer prior to applying the second transparent substrate.

3. The method of producing a precious metallic laminate of claim 1, wherein:

at least some of the plurality of sublayers have a variable thickness across one or both of a length and a width of the respective sublayer.

4. The method of producing a precious metallic laminate of claim 1, wherein:

a thickest sublayer is deposited most proximate the transparent transition layer.

5. The method of producing a precious metallic laminate of claim 1, further comprising:

prior to depositing the metallic layer, preparing the first transparent substrate by:

removing a portion of the first transparent substrate;

dehydrogenating the first transparent substrate;

cleaning the first transparent substrate; and removing oligomers from the first transparent substrate.

6. The method of producing a precious metallic laminate of claim 1, wherein:

the metallic layer comprises a first portion having a thickness of at least about 200 nm and a second portion having a thickness of less than about 200 nm.

7. The method of producing a precious metallic laminate of claim 1, wherein:

a variation of thickness of the metallic layer less than 5% across a surface area of the metallic layer.

8. The method of producing a precious metallic laminate of claim 1, further comprising:

trimming one or more lateral edges of the metallic layer.

* * * * *